United States Patent [19]
Henning

[11] Patent Number: 5,532,596
[45] Date of Patent: Jul. 2, 1996

[54] METHOD FOR THE MEASURMENT OF MAGNETIC RESONANCE ("CONTINUOUS SATURATION")

[75] Inventor: Jürgen Henning, Freiburg, Germany

[73] Assignee: Klinikum der Albert-Ludwigs Universitat Freiburg, Freiburg, Germany

[21] Appl. No.: 393,206

[22] Filed: Feb. 23, 1995

[30] Foreign Application Priority Data

Feb. 24, 1994 [DE] Germany ............... 44 05 979.5

[51] Int. Cl.$^6$ ............................................. G01V 3/00
[52] U.S. Cl. ............................................. 324/309; 324/307
[58] Field of Search ............................ 324/300, 306, 324/307, 309, 318, 322; 128/653.2, 653.3, 653.4

[56] References Cited

U.S. PATENT DOCUMENTS

| | | | |
|---|---|---|---|
| 5,010,300 | 4/1991 | Paley et al. | 324/322 |
| 5,073,752 | 12/1991 | DeMeester et al. | 324/309 |
| 5,298,862 | 3/1994 | Henning | 324/307 |
| 5,315,250 | 5/1994 | Ehnholm et al. | 324/309 |
| 5,368,033 | 11/1994 | MoshFeghi | 324/306 |

FOREIGN PATENT DOCUMENTS 3434161   3/1986   Germany .

OTHER PUBLICATIONS

"Klinische Kernspintomographie" ed. Josef Lissner and Manfred Seiderer, Enke Verlag Stuttgart (1990), pp. 24ff. and 101ff. and 111ff.

*Primary Examiner*—Michael Tokar
*Attorney, Agent, or Firm*—Cesari and Mckenna

[57] ABSTRACT

In a method of nuclear magnetic resonance imaging according to the multislice technique, in addition to the usual signal producing sequence, a further radio frequency pulse of low bandwidth is utilized in the presence of a slice selection gradient which serves as a saturation pulse on one slice of the complete multiple slice packet being investigated, whereby the sequence order of saturation pulses and of the correspondingly read-out slices is shifted by a constant interval with respect to each other in such a fashion that the signal saturation of each read out signal results from the relaxation of the correspondingly read out signal in the time interval between the saturation pulse and the excitation of the corresponding slice. In this fashion the number of slices can be continuously increased, whereby the entire measuring time increases linearly with the slices while the image contrast remains constant.

6 Claims, 1 Drawing Sheet

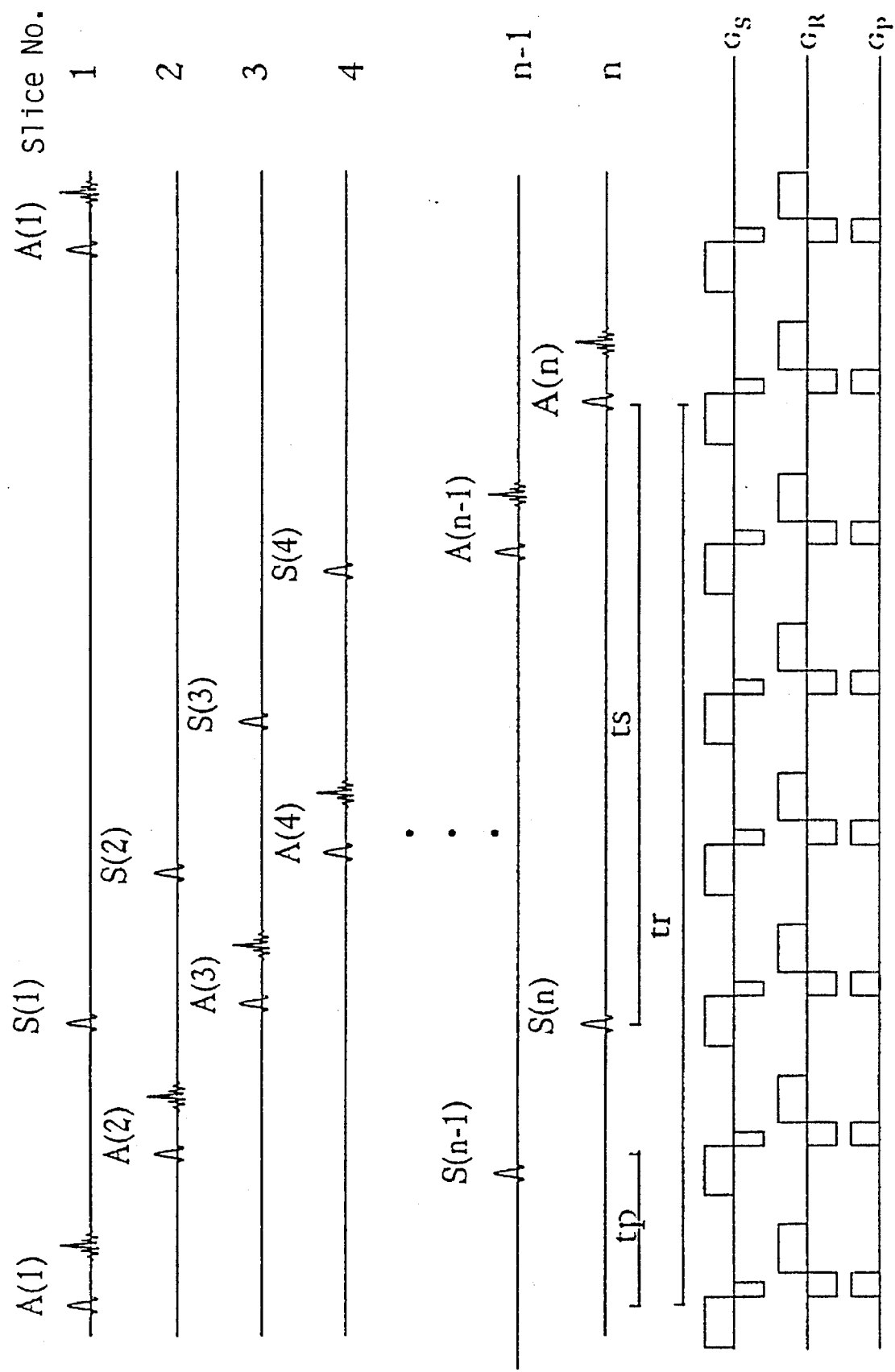

METHOD FOR THE MEASUREMENT OF MAGNETIC RESONANCE ("CONTINUOUS SATURATION")

BACKGROUND OF THE INVENTION

The invention concerns a method of magnetic resonance imaging in accordance with the multislice technique with which a single slice (of a measuring object) is initially excited through the application of a radio frequency pulse of low bandwidth in the presence of a slice selection gradient and the transverse magnetization located in the excited slice is subsequently dephased via a time-limited gradient pulse of the so-called read gradient in a direction perpendicular to the plane of the slice, and the dephased magnetization is refocused through the application of an additional radio frequency pulse of low bandwidth in the presence of a slice selection gradient, whereby the bandwidth and the steepness of the gradient are chosen in such a fashion that the refocusing includes precisely those magnetizations which are excited by the first measuring pulse and, through the application of an additional read gradient, a so-called spin echo is subsequently produced which is phase-encoded for imaging by application of a phase-encoding gradient perpendicular to the read and slice gradients in accordance with the two-dimensional Fourier transformation method, whereby the phase encoding gradient can be applied at an arbitrary time between excitation and read out of the transverse magnetization, however, not during application of the radio frequency pulse and the same procedure is subsequently carried out on other slices until, after a predetermined time interval, the same procedure is repeated beginning at the originally chosen slice, whereby the phase encoding of the signal is, however, varied until all individual differing phase-encoded signals required for image reconstruction of all slices are present.

A method of this kind is, for example, known in the art from D. Stark et al., Magnetic Resonance Imaging, Mosby Year Book, St. Louis, 1992, pp. 115ff.

When optimizing the measuring time for recording a large measuring volume with the assistance of the multislice technique, there presently exists the problem that the maximum possible number of slices is limited by the repetition time of the recording of projections of the same slice. In the event that slices in excess of the thereby predetermined number are to be investigated, it is necessary to repeat the acquisition while shifting the slice packet. This causes problems principally when the acquisition is carried out under utilization of a rapid acquisition sequence in a time interval during which the patient is supposed to hold his breath. An acquisition repetition in two breathing cycles causes problems for the investigation of the stomach organs, since breathing displaces same by several centimeters and continuity in the entire volume being investigated cannot therefore be guaranteed.

It is therefore the purpose of the present invention to present a method of the above-mentioned kind with which the measuring volume can be increased in a quasi-continuous fashion through the increase in the number of recorded slices without requiring the acquisition of a completely new slice packet displaced by a length with respect to the original one.

SUMMARY OF THE INVENTION

This purpose is achieved in accordance with the invention in that, in addition to the described signal producing sequence, an additional radio frequency pulse of low bandwidth is utilized in the presence of a slice selection gradient, which serves as a saturation pulse on one slice of the entire multislice packet being investigated, whereby the sequence order of the saturation slices and the respectively selected slices is displaced with respect to each other by a constant interval in such a fashion that the signal saturation of the respective signal being read out results from the relaxation of the corresponding signal read out in the time interval between the saturation pulse and the excitation of the corresponding slice.

The method in accordance with the invention permits, the number of slices to be continuously increased by utilizing additional saturation pulses, whereby the entire measuring time for recording of the image data increases linearly with the number of slices with, however, the image contrast remaining constant in accordance with the initial conditions. Conversely, the image contrast can be varied independently of the slice repetition time in the method in accordance with the invention.

In an advantageous embodiment of the method in accordance with the invention, a multislice-multiecho method is utilized for signal production instead of the normal multiple slice method.

The method in accordance with the invention can also advantageously be utilized in other conventional nuclear magnetic resonance signal excitation sequences and, for example, the signals can be excited utilizing the multislice RARE method.

The utilization of a multislice gradient echo sequence is particularly advantageous since, in this case, very short sequence repetition times are a priori envisioned and the problem described above is exacerbated. In a particularly preferred embodiment of the method in accordance with the invention, high frequency pulses are utilized which simultaneously produce signals in a particular slice while saturating another slice. In this fashion, the additional time interval otherwise necessary for the saturation pulse is absent so that the sequence is altogether faster.

In a further advantageous embodiment, an inversion pulse is utilized instead of a saturation pulse. Through the application of the inversion pulse with which the z-magnetization is inverted, it is possible to achieve an increased $T_1$-weighting and thereby an increased contrast in the produced images.

In a further advantageous embodiment of the method in accordance with the invention, the resolution within each slice is increased by means of phase encoding steps in the slice direction. In this fashion the above-mentioned method in accordance with the invention is extended to three-dimensional applications.

Additional advantages of the invention can be derived from the description and the accompanying drawing. The above-mentioned features and those which are to be described in accordance with the invention can be utilized individually or collectively in arbitrary combination. The embodiment mentioned is not to be considered as an exhaustive enumeration rather has exemplary character only.

The invention is represented in the drawing and is described and explained more closely with the embodiment.

BRIEF DESCRIPTION OF THE DRAWING

The figure shows a pulse and gradient scheme for the method in accordance with the invention plotted against time.

DESCRIPTION OF THE PREFERRED EMBODIMENT

One of the preferred methods of nuclear magnetic resonance imaging according to the principle of two-dimensional Fourier transformation consists in the application of the so-called multislice method. In this case, the repetition time for acquisition of two phase encoding steps is initially determined according to the desired $T_1$-contrast. Subsequently, in the event that sampling of a large measuring volume is desired, the number of slices which can be recorded within the chosen repetition time is determined. This determines the signal saturation and thereby the $T_1$-contrast of the images. The repetition time tr is thereby equal to the saturation time ts. If tp is the time for recording of an individual projection of a slice, the maximum number Nmax of slices which can be recorded in the multislice technique during one recording cycle is Nmax=tr/tp. The entire measuring time tges is then given as a function of the number of phase encoding steps np as $$tges = np \cdot tr = np \cdot Nmax \cdot tp.$$

For a typical application of a $T_1$-weighted spin echo sequence with a repetition time of 500 ms, in practice, Nmax=20. Since the chosen slice thickness dS and slice separation (defined as the separation between the middle of neighboring slice) DS are determined by the size of the lesions to be observed, the entire recorded measuring volume is given as (Nmax−1) DS+dS. To maintain the image contrast in prior art, the measurement had to be repeated even in order to investigate only a slightly larger volume, which corresponded to a doubling of the measuring time. Although in this fashion the number of recorded slices is doubled this is, however, often not even desirable.

The possibility of a continuous variation of the entire recording time along with the measuring volume is represented in the drawing. Additional radio frequency pulses are introduced into the basic sequence, which each lead to one slice of the slice packet being investigated. For a number N>Nmax of slices under investigation, the N+Nmax modulo Nmax slice is saturated directly before excitation of the nth slice. For N=12 and Nmax=8 the time dependence of the sequence of read steps A(n) and saturation steps S(n) is given, for example, by the following scheme:
S(9)-A(1)-S(10)-A(2)-S(11)-A(3)-S(12)-A(4)-S(1)-A(5)-S(2)-A(6)  -S(3)-A(7)-S(4)-A(8)-S(5)-A(9)-S(6)-A(10)-S(7)-A(11)-S(8)-A(12).

The sequence of slices for saturation is therefore displaced forwards relative to the read out sequence by Nmax. The repetition time tr is thereby larger than the saturation time ts. In this manner N can be arbitrary increased with respect to Nmax. The entire measuring time tges is then given by tges=np·N·tp. It therefore increased linearly with the number of slices, whereby the $T_1$-contrast remains constant independent of N through Nmax tp.

This method principle can be utilized independently of the measuring sequence chosen to extract the imaging information as long the sequence utilized is capable of being carried out by means of the multislice method. As already mentioned, the possibility of continuous variation of the measuring time is especially advantageous for rapid imaging. For example, when utilizing the RARE sequence and producing 5 different phase encoding echoes per excitation in 25 excitation cycles, 125 phase encoding steps can be recorded. With a repetition time of 500 ms the recording is completed in a total time tges=12,5 s. Due to the production of 5 echoes tp is, however, larger than that of a spin echo sequence. Under utilization of known gradients, tp is approximately 40 ms. In this fashion a maximum of 12 slices can be investigated. If one takes, in accordance with experience, an upper bound of 20 s for recording a breathing sequence, the number of slices to be investigated can be increased to 20 with otherwise constant parameters.

Similar exemplary applications result for the use of gradient echo sequences and other measurement methods which are multislice-capable.

The order of the slices must not necessarily thereby be sequential, rather can be carried out in arbitrary series as long as the sequence of saturation pulses corresponds to that of the excitation pulses with displacement by Nmax.

It is furthermore possible to prevent the slight increase in tp due to incorporation of saturation pulses by the inclusion of pulses which simultaneously act as excitation pluses for the slice n as well as saturation pulses for the slice n+Nmax modulo Nmax. Such pulses acting on a plurality of different slices are known in the art from publications for a plurality of applications and can be calculated using the superposition principle from both of the pulses which each act on a corresponding individual slice through addition of both complex pulse forms.

The method described can be applied to those recording techniques with which the position resolution of the multislice sequence within each slice is increased in the slice selection direction through additional phase encoding steps ("3D-Multislab", "MOTSA").

We claim:

1. A multislice magnetic resonance imaging method comprising the steps of:

a) switching on a first slice selection gradient;

b) radiating a first radio frequency pulse in the presence of the first slice selection gradient to coherently excite a transverse magnetization in a first slice of a measured object;

c) switching on a first read gradient to dephase the coherent transverse magnetization;

d) switching on a second slice selection gradient having a gradient bandwidth and gradient steepness to rephase the dephased transverse magnetization;

e) radiating a second radio frequency pulse in the presence of the second slice selection gradient to rephase the dephased transverse magnetization;

f) switching on a second read gradient to generate a spin echo;

g) switching on a phase encoding gradient at a phase encoding time between the first radio frequency pulse and a read-out time of the transverse magnetization;

h) radiating, in the presence of a slice selection gradient, one of a saturation and an inversion radio frequency pulse displaced relative to the read-out time by a constant time interval to one of saturate and invert a read-out signal in dependence on a relaxation of the read-out signal during a time interval between the one of the saturation and the inversion pulse and the first radio frequency pulse;

i) repeating steps a) through h) on additional slices; and j) repeating steps a) through i) under variance of the phase encoding gradient to generate signals needed for two-dimensional Fourier transformation image reconstruction of the first and the additional slices.

2. The method of claim 1, wherein a multislice-multiecho method is utilized for signal production.

3. The method of claim 1, wherein a multislice RARE method is utilized.

4. The method of claim 1, wherein a multislice gradient echo sequence is utilized.

5. The method of claim 1, wherein radio frequency pulses are utilized which cause a simultaneous excitation of a signal in one slice and saturation in another slice.

6. The method of claim 1, wherein a resolution within each slice is increased by phase encoding steps in a slice direction.

* * * * *